United States Patent
Amatangelo et al.

(10) Patent No.: US 6,791,363 B1
(45) Date of Patent: Sep. 14, 2004

(54) MULTISTAGE, SINGLE-RAIL LOGIC CIRCUITRY AND METHOD THEREFORE

(75) Inventors: Matthew J. Amatangelo, Austin, TX (US); Taqi Nasser Buti, Millbrook, NY (US); Christopher M. Durham, Round Rock, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 10/388,974

(22) Filed: Mar. 13, 2003

(51) Int. Cl.[7] .................. H03K 19/096; G11C 8/00; H04L 7/00
(52) U.S. Cl. .................. 326/96; 365/233.5; 375/355
(58) Field of Search .................. 326/96; 327/12, 327/14; 365/233, 233.5; 375/344, 354, 355, 377; 713/500, 501, 503

(56) References Cited

U.S. PATENT DOCUMENTS

| | | | | |
|---|---|---|---|---|
| 5,374,894 A | * | 12/1994 | Fong | 327/14 |
| 5,533,069 A | * | 7/1996 | Fleek et al. | 375/344 |
| 6,272,070 B1 | * | 8/2001 | Keeth et al. | 365/233.5 |
| 6,429,693 B1 | * | 8/2002 | Staszewski et al. | 327/12 |
| 6,606,361 B1 | * | 8/2003 | Rowell | 375/355 |
| 6,621,883 B1 | * | 9/2003 | Ton | 375/377 |

* cited by examiner

Primary Examiner—Patrick Wamsley
(74) Attorney, Agent, or Firm—Casimer K Salys; Anthony V.S. England

(57) ABSTRACT

According to one form of the invention, an apparatus includes first timing circuitry, at least one stage of logic circuitry and second timing circuitry. The first timing circuitry has a first data input and a latch with a latch data input coupled to the first data input and a latch data output coupled to an input of the least one stage of logic circuitry. The second timing circuitry has a latch and an edge detector with respective latch and edge detector data inputs coupled to a data output of the at least one stage of logic circuitry. The edge detector has an output coupled to a control input of the second timing circuitry latch for triggering capture of an output data signal on the data output of the at least one stage of logic circuitry responsive to detecting a signal transition.

22 Claims, 7 Drawing Sheets

MULTISTAGE, SINGLE-RAIL LOGIC CIRCUITRY AND METHOD THEREFORE

BACKGROUND OF THE INVENTION

1. Field of the Invention

The present invention concerns multistage, single-rail logic circuitry, and more particularly concerns such circuitry having inter-stage timing elements.

2. Related Art

As computers operate at higher speeds, cycle time of their component logic circuits must decrease. Moreover, the operating speed of the logic circuits must improve disproportionately. That is, as cycle time decreases, the amount of clock skew, latch delay and set up time become a larger portion of each cycle. Since a logic circuit must wait for valid data before evaluating in each cycle, the increasingly large portion of cycle time that must be devoted to clock skew, latch delay and set up time leaves a correspondingly smaller portion of the cycle available for evaluating data. Consequently it presents a very a demanding challenge to design logic circuitry for improved cycle time.

Certain terms are used herein that relate to logic circuitry. The terms "dual-rail" and "single-rail" are used to distinguish between logic circuitry for which each input and output has a respective complementary input and output ("dual-rail logic circuitry") and logic circuitry which does not necessarily receive a complement for each input nor generate a complement for each output. The term "dynamic logic" is used to refer to logic circuitry that is structured to operate in a sequence of pre-charging and then evaluating. "Static logic" refers to logic circuitry that continuously evaluates whatever is presented to its input or inputs. "Pipelining" or "pipelined" refers to logic connected in a series of stages with a timing mechanism of some sort to control the passing of data from one logic stage to the next, or at least to control the passing of data into or out of a series of logic stages.

Various approaches have been developed to improve logic circuit cycle time. FIG. 1 illustrates a design for one circuit 100, according to the prior art. This two-stage, self-timed pipelined logic circuit 100 is implemented with dynamic logic and Mueller-C inter-stage timing elements. More specifically, the pipelined circuit 100 has first and second logic stages 110 and 120 of dual-rail, dynamic logic, with a first Mueller-C inter-stage timing element 118 on the output of the first logic stage 110 and a second Mueller-C element 128 on the output of the second logic stage 120.

To ensure orderly timing of data from one stage to the next, both of the complementary output lines of the respective logic stages 110 and 120 are coupled to respective NOR gates 114 and 124 in order to detect completion of logic evaluation for the respective stages and to signal the completion to the Mueller-C elements 118 and 128 through interposed inverters 116 and 126. That is, in its precharge interval, logic stage 110, for example, is reset by a signal on its reset input, which causes both its output data lines to go low, driving the NOR gate 114 output high and the inverter 116 output, i.e., request input to Mueller-C element 118, low. Then, when valid data is available at the inputs of the first stage 110, the request0 signal to the first stage 110 "reset" input is asserted and the logic 110 responsively evaluates, driving one of the data lines low and the other high. The complementary state of the data drives the NOR gate 114 output low and inverter 116 output high, which drives the Meuller-C element 118 output high, triggeringevaluation of the now valid data on the inputs to the second stage 120. Once logic stage 120 evaluates, its NOR gate 124 output goes low, which is fed back to the Mueller-C element 118 "ackn" input. Consequently, the Mueller-C element 118 output goes low and resets logic 120, and so on.

While this circuit 100 is advantageous speed-wise, its logic stages have to be dual-rail so that completion can be detected and signaled from one stage to the next. This is problematic in one respect, since dual-rail logic tends to take up more space than does single-rail logic. Also, the handshaking arrangement of circuitry 100 is complex in some respects. Power consumption may also be an issue with this arrangement.

FIG. 2 illustrates a two-stage, clocked pipeline circuit 200 which addresses some aspects of the limitations of the pipelined circuitry of FIG. 1. That is, circuitry 200 may be implemented with single-rail, static logic, and with clocked latches, according to the prior art. Specifically, the pipeline circuit 200 has first and second logic stages 220 and 240 of single-rail, static logic, with an input latch 210 and an output latch 250, clocked by a signal C2. Between the logic stages 220 and 240 is a latch 230, timed by a clock signal C1. The latch 230 is referred to as a "mid-cycle" latch because its clock signal C1 is phase shifted with respect to C2, in order to ensure that data does not pass through both logic stages 220 and 240 in a single cycle of clock C1. The combination of the mid-cycle latch and the timing of the clock signals C1 and C2 ensures orderly data evaluation from one logic stage to the next.

The single-rail aspect of circuitry 200 of FIG. 2 reduces complexity and the area required for the circuit as compared to the dual-rail circuit 100 of FIG. 1. Nevertheless, circuit 200 does not have the same speed advantage as the circuit 100 of FIG. 1, since circuit 200 is not self-timed and has two latches in the critical path in each clock cycle. Also, the circuits of both FIGS. 1 and 2 evaluate every clock cycle or upon every request, regardless of whether the input data has changed.

From the above brief discussion of related art, it should be appreciated that further improvements are needed in logic circuitry to improve the trade off between speed and energy consumption.

SUMMARY

The foregoing need is addressed in the present invention, according to which, in an apparatus form of the invention, an apparatus includes first timing circuitry, at least one stage of logic circuitry and second timing circuitry. The first timing circuitry has a first data input and a latch with a latch data input coupled to the first data input and a latch data output coupled to an input of the least one stage of logic circuitry. The second timing circuitry has a latch and an edge detector with respective latch and edge detector data inputs coupled to a data output of the at least one stage of logic circuitry. The edge detector has an output coupled to a control input of the second timing circuitry latch for triggering capture of an output data signal on the data output of the at least one stage of logic circuitry responsive to detecting a signal transition.

Objects, advantages, additional aspects and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 3:
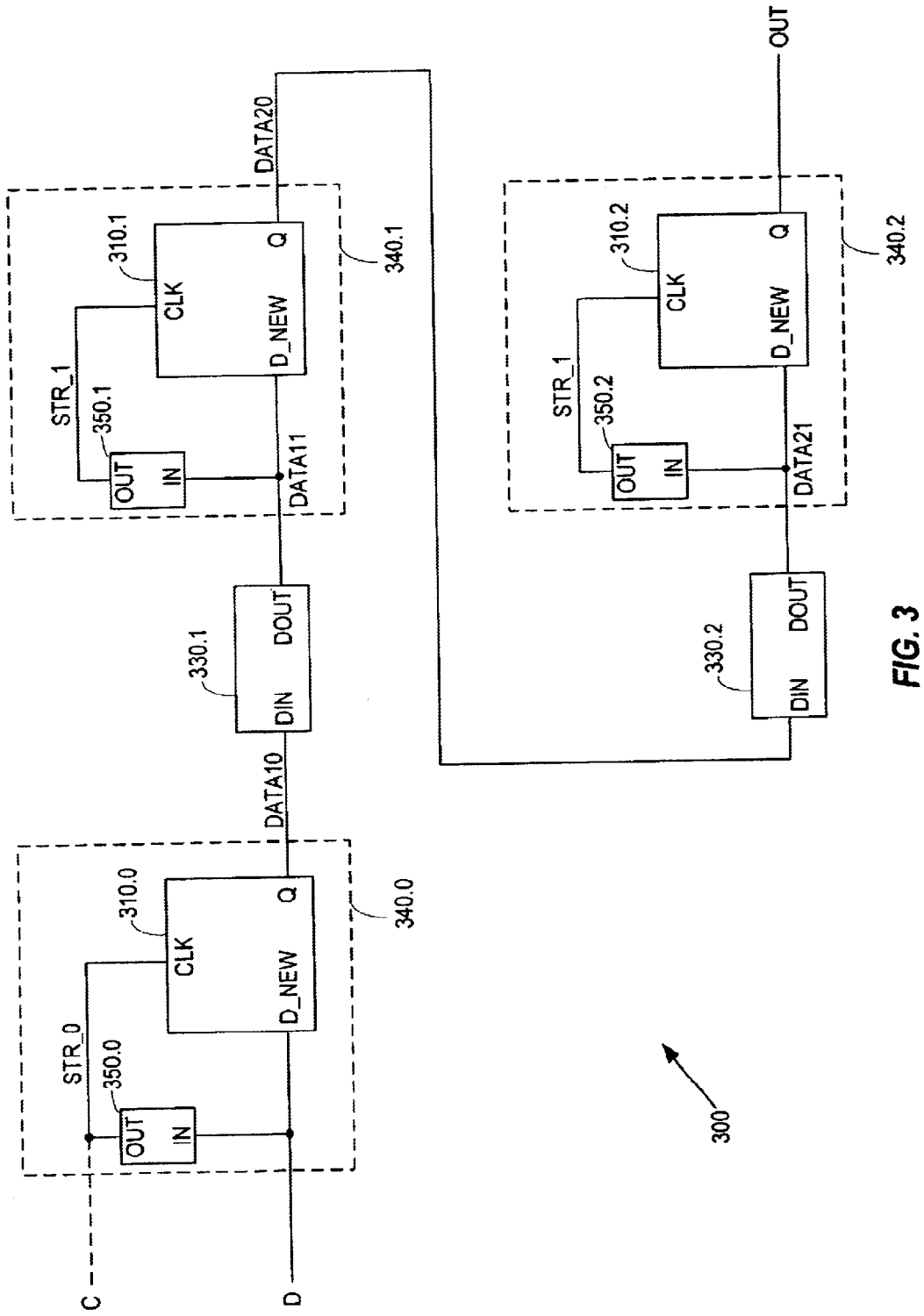
FIG. 3 illustrates a pipelined logic circuit, according to an embodiment of the present invention.

Referring now to FIG. 3, a pipelined logic circuit 300 is illustrated, according to an embodiment of the present invention. The logic circuit 300 is operable to receive a binary data input signal on input line "D," such as from a preceding logic circuit (not shown). (Note, a data signal herein is generally referred to by the same name as the line on which it is asserted or deasserted. Thus the data signal on line D, for example, may be referred to herein as "data D," or as merely "D.") Logic circuit 300 also receives a timing signal (also known as a "clocking signal" or "clock signal") on input line "C." The timing signal may be from a clock external to the logic circuit. The input lines C and D are coupled to an input timing circuit 340.0, which includes a latch circuit 310.0 and a edge detecting circuit 350.0.

There are numerous instances of certain circuits in logic circuit 300, such as latch circuit 310.0, for example. These duplicated circuits are herein distinguished by successive suffixes when referring to specific ones of the instances. For example, second and third instances of the circuitry of latch 310.0 are referred to as latch circuitry 310.1 and 310.2, respectively. In a more generic context which describes aspects of the circuitry applicable to all the instances, such duplicated circuitry may be referred to herein without a suffix. For example, in describing the circuitry of FIG. 4 herein regarding circuit structure and function that is the same for each of the latch circuits 310.0, 310.1 and 310.2, the circuitry is referred to simply as latch circuitry 310.

Edge detector circuit 350.0 of circuitry 300 has its output coupled to the line STR_0 and its input coupled to line D, for data from a preceding logic circuit (not shown). The detector 350.0 outputs a timing signal on line STR_0 responsive to detecting a transition of data D from the preceding logic circuit. In an alternative embodiment of timing circuitry 340.0, STR_0 may instead be coupled to a clock signal external to the logic circuit, in which case edge detecting circuitry 350.0 may be omitted.

Circuitry 300 includes input latch circuit 310.0, which has its data input coupled to the data line D and its output coupled to line DATA10. The input latch circuit 310.0 has a control input coupled to the output of the edge detector circuitry 350.0 and "opens" responsive to a rising edge of the timing signal on line STR_0, i.e., passes the signal on D unaltered through the latch 310.0 to the output DATA10. The latch circuit 310.0 "closes" responsive to a falling edge of the timing signal, thereby capturing and holding the data state on DATA10, until the next rising edge of the timing signal STR_0. That is, until the next rising edge of the timing signal STR_0, latch 310.0 effectively asserts or deasserts the data D on the latch 310.0 output DATA10 at whatever state D had at the time of the falling STR_0 edge when the data D was captured, regardless of and independent of any intervening change that may occur to D on the latch input 310.0.

The output of latch 310.0 is coupled via line DATA10 to an input of a first logic circuit 330.1, also referred to as a first "stage" of logic circuitry. Logic circuit 330.1 has an output coupled to line DATA11, which, in turn, is coupled to an input of a first inter-stage timing circuit 340.1. The inter-stage timing circuit 340.1 has an output coupled to a line DATA20, which, in turn, is coupled to an input of a second logic circuit 330.2, also referred to as a second "stage." Logic circuit 330.2 has an output coupled to line DATA21, which, in turn, is coupled to an input of a second inter-stage timing circuit 340.2. The inter-stage timing circuit 340.2 has an output coupled to a line labeled "OUT."

The logic circuits 330.1 and 330.2 include conventional single-rail logic circuitry. The logic circuitry of circuits 330 may include static, dynamic, passgate or transmission gate circuitry, or combinations thereof, as are well know for performing simple logic functions such as AND, OR, NOR, NAND, NOT, XOR, XNOR, etc. or even for performing more complex functions such as adding, subtracting, multiplying, dividing, shifting, incrementing, decrementing, comparing, multiplexing, etc.

Timing circuitry 340.1 has an edge detector circuit 350.1 that has an input coupled to the DATA11 line and that is operable to generate a timing signal on an output line STR_1 responsive to detecting a transition in logic states of the data signal on DATA11 from the first logic stage 330.1. According to the present embodiment, the timing signal is asserted in relatively short duration pulses. Consequently, such a timing signal may be referred to herein as a "strobe." The output line STR_1 is coupled to the timing input on a latch 310.1 of the timing circuitry 340.1, so that the short assertion of the timing signal generated by the edge detector circuit 350.1 triggers capture by the latch 310.1 of the data signal on DATA11 from the first logic stage 330.1. In turn, this causes the latch 310.1 to hold the newly captured data on its output, which is coupled to DATA20, so that the second logic stage 330.2 evaluates the new data.

Likewise, timing circuitry 340.2 has an edge detector circuit 350.2 that has an input coupled to the DATA21 line and that is operable to generate a timing signal on an output line STR_2 responsive to detecting a transition in logic states of the data signal on DATA21 from the second logic stage 330.2. The output line STR_2 is coupled to the timing input on a latch 310.2 of the timing circuitry 340.2, so that the timing signal generated by the edge detector circuit 350.2 triggers capture by the latch 310.2 of the data signal on DATA21 from the second logic stage 330.2. In turn, this causes the latch 310.2 to hold the newly captured data on its output coupled to the OUT line.

Figure 4:
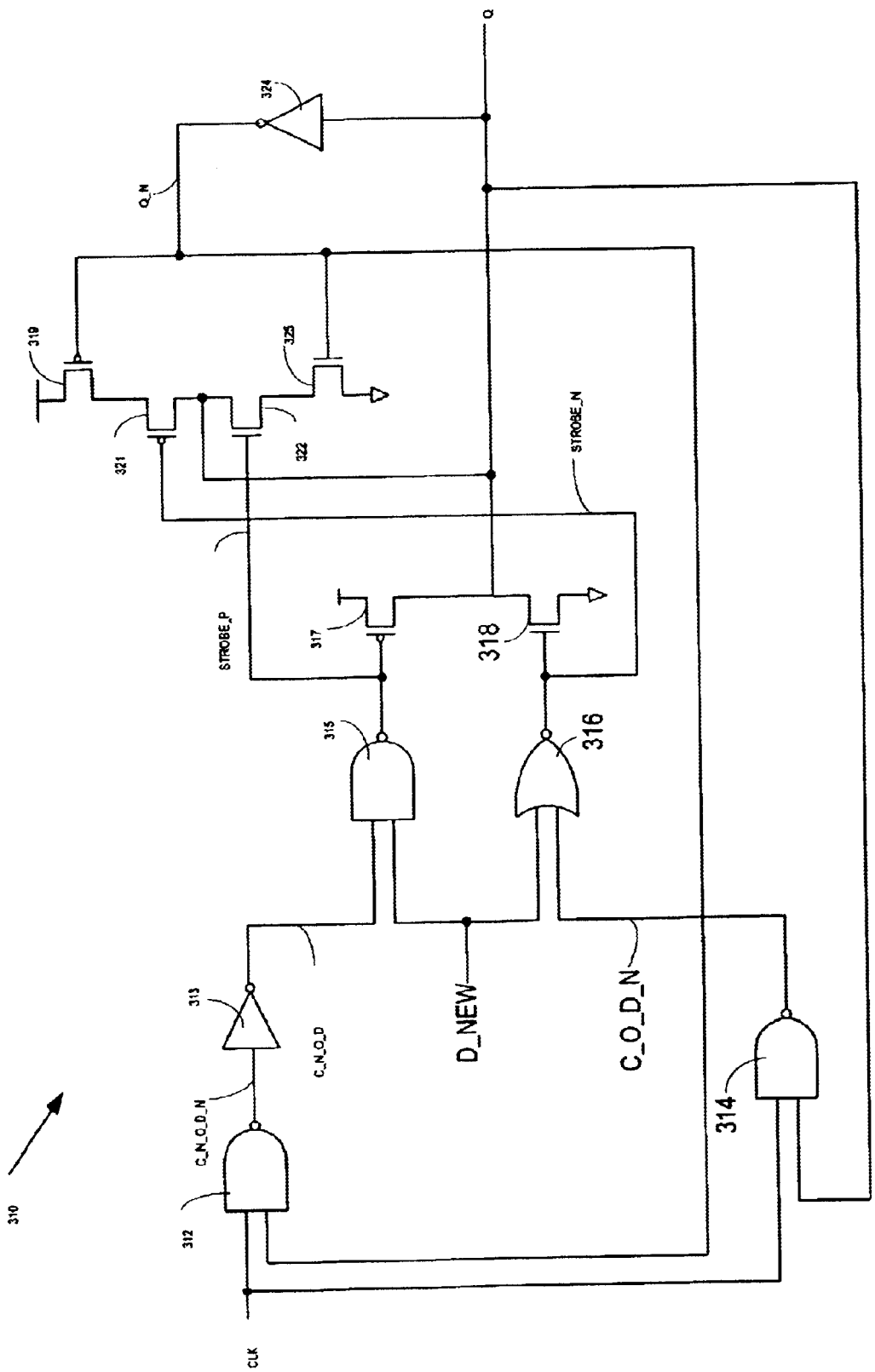
FIG. 4 illustrates a latch circuit, according to an embodiment of the present invention.

It is noteworthy that according to the above described arrangement, the edge detector 350.1 produces no strobe on STR_1 if there is no change in state of the data signal on DATA11, in which case there is no switching of the latch 310.1, logic 330.2, and so on. In similar fashion, if there is no change in data on DATA21 there is no strobe on STR_2, etc. This is advantageous because if there is no change in data, and thus no strobe on the edge detectors, no power is consumed by needless switching. Referring now to FIG. 4, latch circuitry 310 is illustrated, according to an embodiment of the present invention. As previously stated, the latch circuit 310 opens responsive to a rising edge of the timing signal on line C, and then captures the state of the data signal on input line D responsive to a falling edge of the timing signal on line C, holding the captured data state on the latch 310 output until the next rising edge of the timing signal. That is, from one edge of C to the next, latch 310 effectively holds on its output the data state that was captured on its input coincident with the edge of timing signal C, regardless of any intervening change that may occur to the signal on the input line D. The line labeled "CLK" is connected to the output from an edge detector 350. The line and labeled "D_NEW" is connected to the output from the previous logic stage 330. The output line labeled "Q" is connected to the input of the succeeding logic stage 330, or, in the case of the last latch circuit 310 in the logic pipeline circuit 300, is the output for the circuit 300.

More specifically, CLK is connected to inputs for respective NAND gates 312 and 314. NAND gate 312 has another input that is coupled to the output of inverter 324, which receives and inverts the previously latched data, that is, output "Q." NAND gate 314 has another input that is coupled directly to output "Q." The output of NAND gate 312 is referred to as "C_N_O_D_N." The output of NAND gate 314 is referred to as "C_O_D_N."

With this configuration, if the latch 310 is holding a low state on its output Q, then responsive to the CLK input going high NAND 312 drives node C_N_O_D_N low, and NAND 314 continues to hold its output node "C_O_D_N" high. Inverter 313, with its input coupled to node C_N_O_D_N, drives its output node "C_N_O_D" high responsive and will low to the inverter 313 output going low.

Node C_N_O_D_N is coupled to a first input of another NAND gate 315, which has a second input coupled to "D_NEW." Node C_O_D_N is coupled to a first input of a NOR gate 316, which also has a second input coupled to "D_NEW."

The output of NAND gate 315 is referred to as node "STROBE_P." Responsive to node C_N_O_D going high, if D_NEW is high the NAND gate 315 drives "STROBE_P" low.

P type field effect transistor ("FET") 317 and N FET 318 have their conducting electrodes coupled in series, with their common electrodes coupled to node Q and their gates coupled to the outputs of NAND 315 and NOR 316, respectively.

The latching function of latch 310 if performed by PFET's 319 and 320 and NFET's 322 and 323 coupled with their conducting electrodes in series, the gates of the top PFET 319 and bottom NFET 323 coupled to the output of inverter 324 (node "Q_N"), the gate of PFET 321 coupled to STROBE_N and the gate of NFET 322 coupled to STROBE_P.

STROBE_P going low turns on PFET 317, writing a logic "one" into the latch, i.e., drives Q high.

If the latch 310 is holding a high state on its output Q, then responsive to the CLK input going high NAND 314 drives C_O_D_N low. The output of NOR gate 316 is referred to as node "STROBE_N." Responsive to node C_O_D_N going low, if D_NEW is low the NOR gate 316 drives "STROBE_N" high, turning on NFET 318, which writes a logic "zero" into the latch, i.e., pulls Q low.

The structure of latch circuitry 310 is particularly well suited for this application since it has no pass gates and therefore none of the driving restrictions for the output that are associated with pass gate circuitry. Also, the latching mechanism exhibits a shorter delay since no contention exists to update the latch node Q, and hence some of the delay of the extra gating is compensated.

Figure 1:
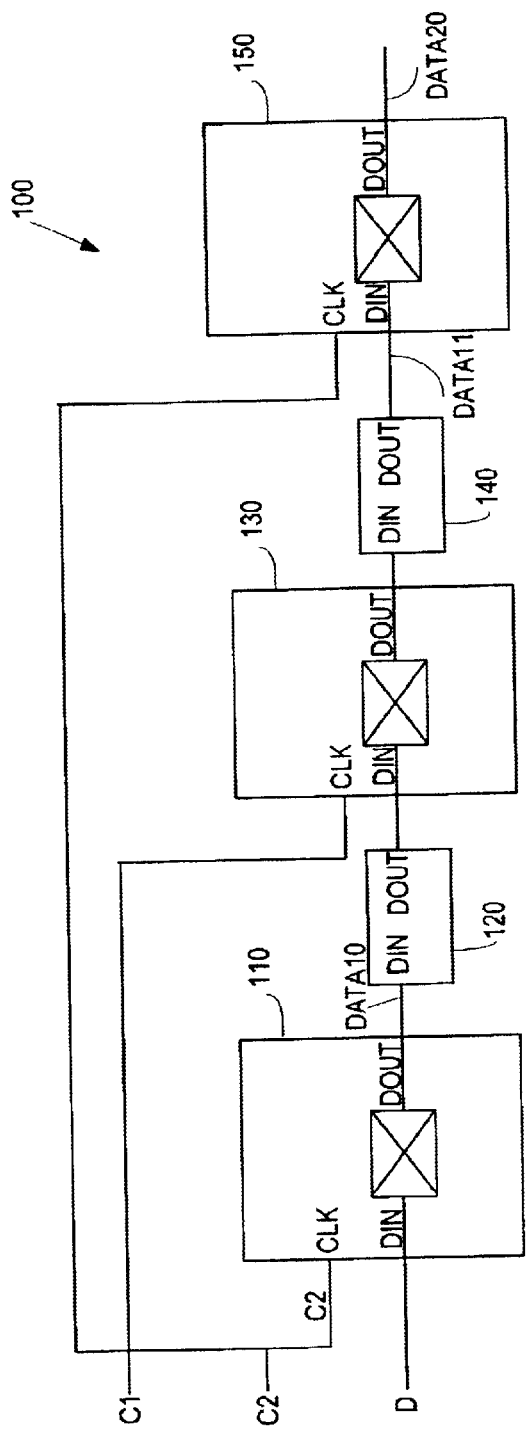
FIG. 1 illustrates a dual-rail, two-stage, self-timed logic circuit, according to the prior art.
Figure 5:
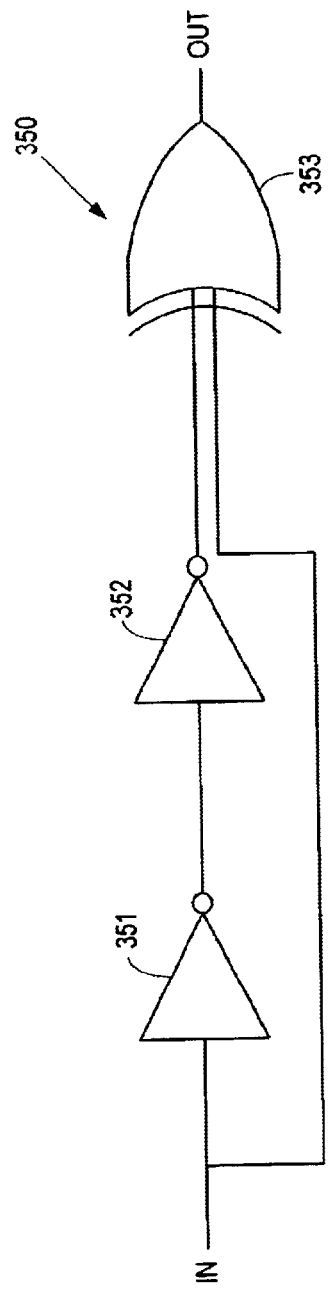
FIG. 5 illustrates an edge detector circuit, according to an embodiment of the present invention.

Referring now to FIG. 5, edge detector circuitry 350 is illustrated, according to an embodiment of the present invention. When a signal transitions to a high state on the "IN" line the signal is immediately received at the B input to XOR gate 353, but at the A input receipt of the changed signal is delayed by inverters 351 and 352. Consequently, until the changed signal state is received at the A input the XOR gate 353 sees complementary signals on inputs A and B, which causes the gate 353 to drive its output high. After the signal at the "IN" line is propagated through the inverters 351 and 352 both the A and B inputs of XOR gate 353 see the same signal, so the output of XOR gate 353 then goes low. Thus, responsive to a change in the input signal to the edge detector circuit 350 (either going high or going low), the circuit 350 strobes its output high briefly. The width of the output pulse is determined by the number of inverters included in series in the circuitry 350. In the illustrated instance circuitry 350 includes the two series-connected inverters 351 and 352, as shown. To ensure glitch free operation of pipelined logic circuitry 300, a Schmitt trigger may be added at the input node or at the output of the XOR gate 353. The Schmitt trigger enables the edge detector 350 to ignore transitions in the input data that don't last long. That is, with the Schmitt trigger, the edge detector 350 ignores brief spikes in the input data, and does not ignore sustained switches in state.

Figure 6:
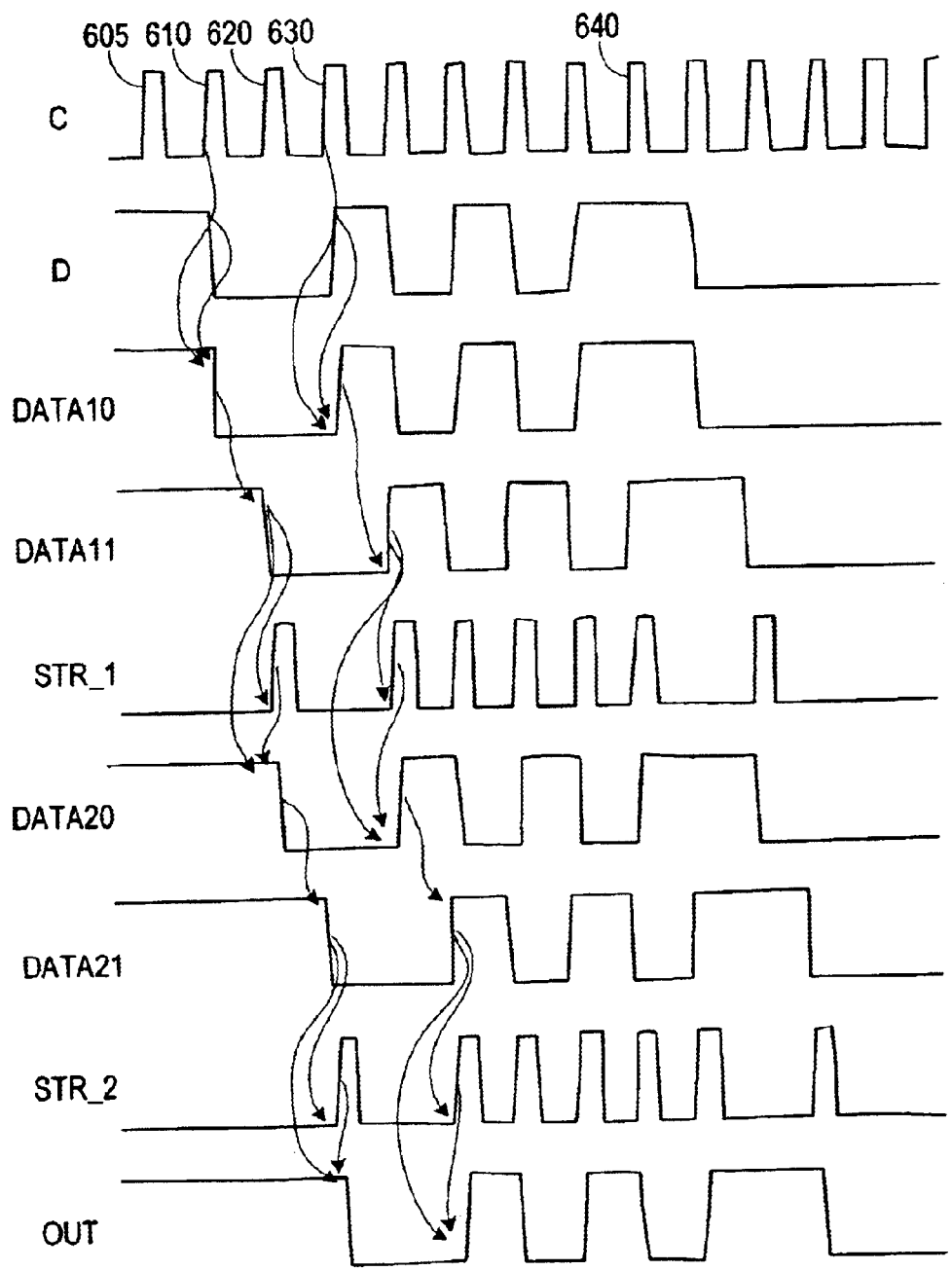
FIG. 6 is a timing diagram setting out certain aspects of operation of the pipelined logic circuit of FIG. 3, according to another embodiment of the present invention.

Referring now to FIG. 6, a timing diagram is illustrated, setting out certain aspects of operation of the pipelined logic circuit of FIG. 3. Proceeding time-wise from left to right and referring also to FIG. 3, note that the timing diagram FIG. 6 corresponds to an embodiment of circuitry 300 in which an external clock generates the timing signal to latch 310.0, and in which edge detector 350.0 is accordingly omitted. Consequently, in FIG. 6 the timing signal to latch 310.0 is referred to in FIG. 6 as "C," instead of "STR_0."

At the first clock C pulse 605, data D has not changed with respect to its state prior to the pulse 605. Consequently, DATA10, DATA11, STR_1, DATA20, DATA21, STR_2 and OUT do not change at this point either.

While the next clock C pulse 610 is asserted, data D falls to a logic "0" state. The 0 state of data D is captured by latch 310.0 responsive to the clock pulse 610, and held on the output DATA10 of the latch 310.0, as shown. Logic 330.1 receives the new state of DATA10, evaluates it, and outputs a new state for DATA11, as shown. (It should be understood, of course, that the new state for DATA11 may be the same as its old state, depending on the logic function of logic 330.1 and the new state of DATA10. To facilitate the example, however, each time a change is depicted in the state of an input to one of the logic's 330 the output is shown to correspondingly change as well.) Responsive to the change in DATA11, edge detector 350.1 generates a pulse STR_1, as shown. Responsive to the assertion of pulse STR_1, latch 310.1 captures the new state of DATA11 and passes it to the output DATA20. Then, responsive to STR_1 being deasserted the latch 310.1 holds the DATA11 on output DATA20, as shown.

Logic 330.2 receives the new state of DATA20 responsive to the latch 310.1 opening upon the rising edge of STR_1, evaluates the new data, and outputs a new state for DATA21, as shown. Responsive to the change in DATA21, edge detector 350.2 generates a pulse STR_2, as shown. Responsive to the assertion of pulse STR_2, latch 310.2 captures the new state of DATA21 and passes it to the output OUT. Then, responsive to STR_2 being deasserted the latch 310.2 holds the new data on output OUT, as shown.

At the next clock C pulse 620, data D has again not changed with respect to its state prior to the pulse 620. Consequently, DATA10, DATA11, STR_1, DATA20, DATA21, STR_2 and OUT again do not change at this point either.

While the next clock C pulse 630 is asserted, data D rises to a logic "1" state. The 1 state of data D is captured by latch 310.0 responsive to the clock pulse 630, and held on the output DATA10 of the latch 310.0, as shown. Logic 330.1 receives the new state of DATA10, and so on, with the change rippling through to the output OUT as shown.

With the next four succeeding clock C pulses after pulse 630 there is a change in data D state for each pulse, so each one of those clock C pulses triggers evaluation of each stage 330 of logic circuitry 300, just as described above for pulses 610 and 630. Then, at the next clock C pulse 640 there is once again no change in data D, as in the instances of clock C pulses 605 and 620, so again there is responsively no switching in logic circuitry 300.

Figure 7:
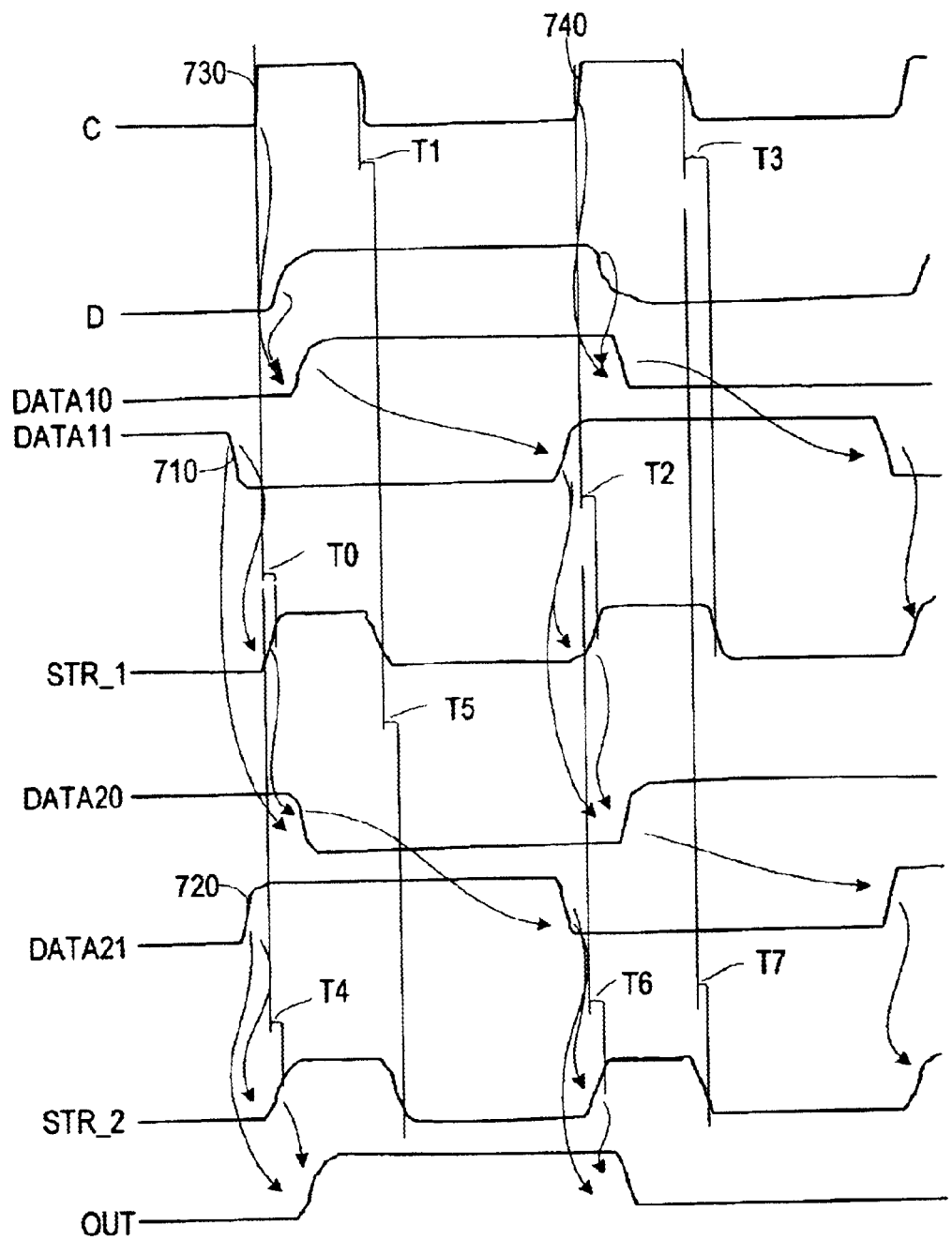
FIG. 7 is timing diagram setting out certain details of the timing shown in FIG. 6, according to another embodiment of the present invention.

Referring now to FIG. 7, a more general timing diagram is illustrated, setting out broader aspects of operation of the pipelined logic circuit of FIG. 3. Referring now to FIG. 7, certain aspects of events shown in FIG. 6 are illustrated in more detail. The first events depicted in FIG. 7 are transitions 710 and 720 of DATA11 and DATA21, respectively, caused by earlier transitions in D and DATA20, not shown. Responsive to the transitions 710 and 720 in DATA11 and DATA21, edge detectors 350.1 and 350.2 pulse their output timing signals STR_1 and STR_2, respectively, as shown.

Note that in the illustrated embodiment the timing signals STR_1 and STR_2 are asserted in coordinated fashion responsive to the falling edge at transition 710 and rising edge at transition 720. Specifically, timing signal STR_1 is asserted within a very slight interval of time t0 before or after the rising edge of clock C pulse 730, which is a predetermined time interval. Similarly, timing signal STR_2 is asserted at 720 within a very small, predetermined interval of time t4 before or after the rising edge of clock C pulse 730. That is, both STR_1 and STR_2 are asserted essentially at the same time as the rising edge of clock C pulse 730. This coordination in switching with respect to the clock C pulse 730 is achieved by tuning propagation time through logic 330.1 and 330.2 or the response time of edge detectors 350.1 and 350.2, or both. (Increasing the propagation time through logic circuitry such as 330 is typically achieved by adding delay elements, such as pairs of inverters. Also, FET gate sizes can be selectively changed to tune propagation time. Transitions can also be selectively skewed to tune timing.) Response time of edge detectors is discussed in connection with FIG. 5 herein above.

Similarly, the falling edges of the STR_1 and STR_2 pulses that occur responsive to falling edge 710 and rising edge 720, are timed in the same manner to occur in coordinated fashion. Specifically, timing signal STR_1 falls within a very slight interval of time t1 before or after the falling edge of clock C pulse 730, while timing signal STR_2 falls a very slight interval of time t5 before or after the falling edge of clock C pulse 730.

Responsive to the rising edge of clock C pulse 730, data D is captured, and then, responsive to a falling edge, held on the output DATA10 of latch 310.0, as show. This change in state ripples through the logic, as shown. Note that in the illustrated embodiment the rising edge of STR_1 that occurs responsive to clock C pulse 730 is timed to occur within a very slight interval of time t2 before or after the rising edge of the next pulse 740 of clock C, i.e., the pulse following pulse 730. Signal STR_2 is timed to fall within a very slight interval of time t6 before or after the rising edge of the next pulse 740 of clock C. The falling edge of pulse STR_1 that occurs responsive to clock C pulse 730 is timed to occur a very slight interval of time t3 before or after the falling edge of the next pulse 740 of clock C, i.e., the pulse following pulse 730. Signal STR_2 is timed to fall a very slight interval of time t7 before or after the falling edge of the next pulse 740 of clock C.

It should be understood the timing with respect to the clock C that is shown in FIG. 7 is optional. In other embodiments the timing signals STR_1 and STR_2 generated by edge detectors 350.1 and 350.2 do not necessarily occur substantially coincident with the timing signal C or STR_0 to the input latch 310.0. In fact, one of the advantages of the present invention is that timing of its operation is flexible enough such that delays inherent in logic's 330 are not constrained by clocks and the timing signals may occur independently of the clock C. There may be many logic stages 330 in logic circuitry 300 and latches 310 may be placed at natural delay points between or after selected ones of the logic stages 330. That is, logic stages 330 may be grouped so that some stages do not have corresponding latches 310.

Figure 2:
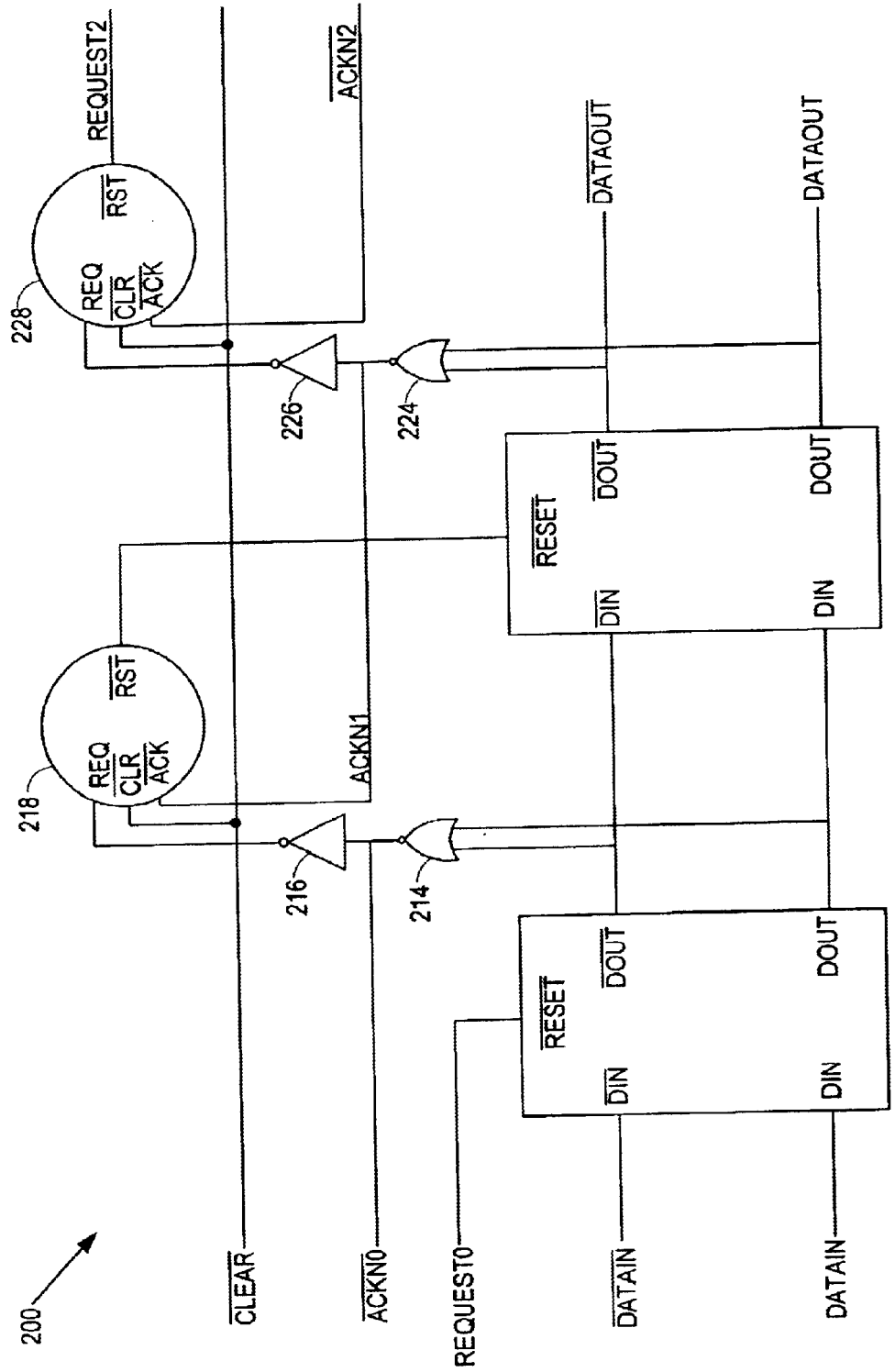
FIG. 2 illustrates a single-rail, two-stage logic circuit with clocked latches, according to the prior art.
Figure 8:
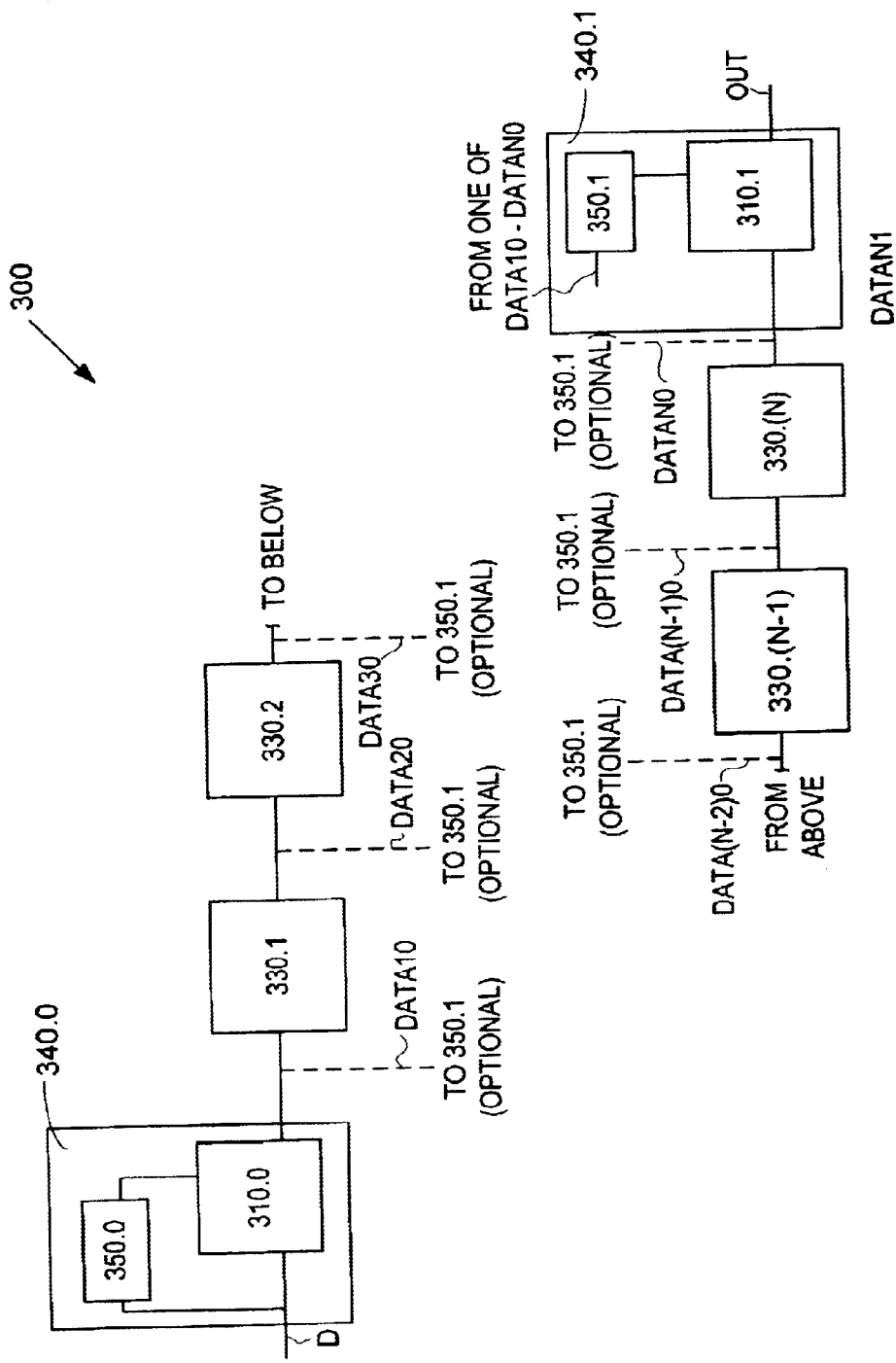
FIG. 8 illustrates a logic circuit having more logic stages than that of FIG. 3, according to another embodiment of the present invention.

Note also, the embodiments of the present invention shown in FIGS. 3 and 8 are advantageous because no mid-cycle latch is required, as in prior art FIG. 2. That is, in the arrangement of FIG. 2, clock signals C1 and C2 are required for alternating latches, with C2 having a fixed phase relation to C1. Usually C2 is 180 degrees out of phase with C1, and thus the latch controlled by C2 is referred to as a "mid-cycle latch." In contrast, as described immediately above, while the logic stages 330 in the embodiments of the present invention may include time delay elements or other means to tune propagation time such that the timing signals generated by the edge detectors 350 have a fixed time relation with respect to the external timing signal to the input latch 310.0, this is optional. The timing signals produced by the respective edge detectors 350 do not have to occur at any particular time with respect to the external timing signal (if there is one) or with respect to one another. Referring now to FIG. 8, another embodiment of logic circuit 300 illustrates this flexibility in timing. Operation of the logic circuitry 300 merely dictates that edge detectors, such as detector 350.1 in FIG. 8, must be tuned to generate their timing signals, which they generate responsive to data transitions, in coordination with the timing of propagation of signals through the logic stages 330.1, 330.2, etc. so that latches, such as output latch 310.1 in FIG. 8, are triggered to capture data after the data has had time to propagate through the logic stages 330.1, 330.2, etc., i.e., when the data is valid at the input to the latch 310.1.

In the embodiment of logic circuitry 300 in FIG. 8 numerous logic stages 330 are grouped together with no latch 310 there between, as shown. Moreover, logic circuit 300 in FIG. 8 illustrates a unique tradeoff between energy consumption and speed provided by the present invention. The logic circuit 300 in FIG. 8 has a number of logic stages 330.1, 330.2, through 330.N coupled in series between an input timing circuit 340.0 and an output timing circuit 340.1. Timing of the opening and closing of output latch 310.0, which captures the data out of the last logic circuitry stage 330.(N), is triggered by a pulse from edge detector 350.1, which is in turn triggered by a transition of one whichever one of the inter-stage data signals is coupled to the edge detector 350.1 input. If one of the early inter-stage data signals, such as DATA10 or DATA 11 or DATA 12, for example, is coupled to the edge detector 350.1 of output timing circuit 340.1, propagation of data from the input D to the output OUT of circuit 300 is faster and the circuit 300 may accordingly cycle more frequently, increasing energy consumption. On the other hand, If one of the later inter-stage data signals, such as DATA1(N) or DATA 1(N−1) for example, is coupled to the output timing circuit 340.1, propagation of data from the input D to the output OUT of circuit 300 is slower and the circuit 300 accordingly cycles less frequently, decreasing energy consumption.

It should be appreciated from the above described embodiments of the present invention that the inclusion of latches in the timing circuitry advantageously permits merging data from other logic circuitry that is external to the apparatus described herein. Data signals at latch points may be connected to latch points of other circuits external to the pipeline.

In addition to what has been described above, many additional aspects, modifications and variations are also contemplated. For example, it should be understood that although the logic circuitry of FIG. 3 is depicted as being one bit wide, this arrangement has been described for the sake of clarity. Preferably each logic block 330 has numerous inputs or outputs, or both. Accordingly, respective input latches 310.0 and timing circuits 340.1 and 340.2 are included for each bit. (As previously mentioned, an edge detector 350.0 may be added to the input latch 310.0 so that timing is responsive to the input data instead of a clock. In such a case there is an edge detector 350 for each input bit)

The above disclosure has been presented for purposes of illustration and is not intended to be exhaustive or to limit the invention to the form disclosed. A preferred embodiment has been disclosed. Many additional aspects, modifications and variations are also contemplated and are intended to be encompassed within the scope of the following claims.

What is claimed is:

1. An apparatus comprising:
   first timing circuitry;
   at least one stage of logic circuitry; and
   second timing circuitry, wherein the first timing circuitry has a first data input and a latch with a latch data input coupled to the first data input and a latch data output coupled to an input of the least one stage of logic circuitry, the second timing circuitry has a latch and an edge detector with respective latch and edge detector data inputs coupled to a data output of the at least one stage of logic circuitry, and the edge detector has an output coupled to a control input of the second timing circuitry latch for triggering capture of an output data signal on the data output of the at least one stage of logic circuitry responsive to detecting a signal transition.

2. The apparatus of claim 1, wherein the first timing circuitry latch is operable to receive an external timing signal on a control input for triggering capture by the first timing circuitry latch of an input data signal on the first data input.

3. The apparatus of claim 2, wherein the at least one logic circuitry stage includes a time delay element providing a signal propagation delay such that the edge detector is operable to assert a signal on the edge detector output at a predetermined time with respect to a rising edge of the external timing signal.

4. The apparatus of claim 1, wherein the second timing circuitry edge detector is operable to assert a pulse responsive to the detecting of the signal transition for the triggering of the capture of the output data signal of the at least one stage of logic circuitry, and the second timing circuitry latch circuit is operable to open responsive to a rising edge of the pulse and close responsive to a falling edge of the pulse, wherein data is held on the latch output responsive to the second timing circuitry latch being closed.

5. The apparatus of claim 4, wherein the second timing circuitry edge detector asserts no pulse if there is no change in state of the output data signal of the at least one stage of logic circuitry.

6. The apparatus of claim 1, wherein the at least one logic circuitry stage includes a number of logic circuitry stages coupled in series between the first timing circuitry and second timing circuitry, the logic circuitry stages being operable to send respective inter-stage data signals from a first one of the logic circuitry stages to a next one of the logic circuitry stages and so on to a last one of the logic circuitry stages, and to send a data signal from the last one of the logic circuitry stages to the second circuitry latch input, wherein one of the data signals is coupled to the second timing circuitry latch for triggering the capture of the data signal from the last one of the logic circuitry stages.

7. The apparatus of claim 6, wherein the data signal coupled to the second timing circuitry is one of the inter-stage data signals.

8. The apparatus of claim 6, wherein the data signal coupled to the second timing circuitry is the data signal from the last one of the logic circuitry stages.

9. The apparatus of claim 1, wherein the first timing circuitry includes an edge detector, having an input coupled to the first data input and an output coupled to the a control input of the first timing circuitry latch, for triggering capture of an input data signal on the first data input by the first timing circuitry latch responsive to detecting a transition in the input data signal.

10. The apparatus of claim 1, wherein the at least one stage of logic circuitry includes first and second stages, and the apparatus includes intermediate timing circuitry having a latch and an edge detector with respective inputs coupled to a data output of the first stage of logic circuitry, the intermediate timing circuitry edge detector having an output coupled to a control input of the intermediate timing circuitry latch for triggering capture of an output data signal on the data output of the first stage of logic circuitry responsive to detecting a signal transition.

11. An apparatus comprising:
   first timing circuitry, wherein the first timing circuitry has a latch with a latch input coupled to a first data input;
   first stage of logic circuitry, wherein the first timing circuitry latch has an output coupled to an input of the first logic circuitry stage;
   intermediate timing circuitry having a latch and an edge detector with respective inputs coupled to a data output of the first logic circuitry stage, wherein the intermediate timing circuitry edge detector has an output coupled to a control input of the intermediate timing circuitry latch for triggering capture of an output data signal on a data output of the first logic circuitry stage by the intermediate timing circuitry latch responsive to detecting a transition in the first stage output data signal;

second stage of logic circuitry, wherein the intermediate timing circuitry latch has an output coupled to an input of the second logic circuitry stage; and second timing circuitry having a latch and an edge detector with respective inputs coupled to an output of the second logic circuitry stage, wherein the second timing circuitry edge detector has an output coupled to a control input of the second timing circuitry latch for triggering capture of an output data signal on the data output of the first logic circuitry stage by the second timing circuitry latch responsive to detecting a transition in the output data signal, wherein the respective edge detectors assert pulses for the triggering of capture of signals on their respective data inputs, and the respective latches are operable to open responsive to rising edges of output pulses from their corresponding edge detectors and close responsive to falling edges of the pulses, wherein data is held on such a latch output responsive to the latch being closed.

12. A method for controlling an apparatus having at least one stage of logic circuitry, the method comprising the steps of:

a) receiving a first data signal on a first data input of first timing circuitry, including receiving the first data signal by a latch of the first timing circuitry;

b) receiving an output signal from the latch by at least one stage of logic circuitry;

c) evaluating the received signal by the at least one stage of logic circuitry;

d) receiving an output signal from the at least one stage of logic circuitry by second timing circuitry, including receiving the at least one logic circuitry output signal by a latch and an edge detector of the second timing circuitry;

e) generating an output signal by the second timing circuitry edge detector responsive to detecting a signal transition of the output signal from the at least one stage of logic circuitry;

f) receiving the output signal from the second timing circuitry edge detector by a control input of the second timing circuitry latch; and g) capturing, by the second timing circuitry latch responsive to the signal received by the control input, the output signal from the at least one stage of logic circuitry.

13. The method of claim 12, wherein the certain signal is an external liming signal.

14. The method of claim 13, wherein step e) includes generating the output signal by the second timing circuitry edge detector at a predetermined time with respect to a rising edge of the external timing signal.

15. The method of claim 12, wherein step e) comprises:

asserting a pulse by the second timing circuitry edge detector responsive to the detecting of the signal transition;

and wherein step g) comprises:

opening the second timing circuitry latch responsive to a rising edge of the pulse; and closing the second timing circuitry latch responsive to a falling edge of the pulse, wherein data is held on the latch output responsive to the second timing circuitry latch being closed.

16. The method of claim 15, wherein the second timing circuitry edge detector asserts no pulse if there is no change in state of the output data signal of the at least one stage of logic circuitry.

17. The method of claim 12, wherein the at least one logic circuitry stage includes a number of logic circuitry stages coupled in series between the first timing circuitry and second timing circuitry, and the method comprises the steps of:

sending respective inter-stage output signals from a first one of the logic circuitry stages to a next one of the logic circuitry stages and so on to a last one of the logic circuitry stages, and step d) includes receiving the output signal from the last one of the logic circuitry stages by the second circuitry latch input, and receiving one of the output signals from one of the logic circuitry stages by the second timing circuitry edge detector.

18. The method of claim 17, wherein the output signal received by the second timing circuitry edge detector is one of the inter-stage output signals.

19. The method of claim 17, wherein the output signal received by the second timing circuitry edge detector is the output signal from the last one of the logic circuitry stages.

20. The method of claim 12, comprising the steps of:

receiving a certain signal by an edge detector of the first timing circuitry;

generating an output signal by the first timing circuitry edge detector responsive to detecting a signal transition of the certain signal;

receiving the output signal from the first timing circuitry edge detector by a control input of the first timing circuitry latch; and capturing the first data signal by the first timing circuitry latch responsive to the signal received by the first timing circuitry control input.

21. The method of claim 12, wherein the certain signal is the first data signal.

22. The method of claim 12, wherein the at least one stage of logic circuitry includes first and second stages and the method comprises the steps of:

receiving an output signal from the first stage of logic circuitry by intermediate timing circuitry, including receiving the first stage logic circuitry output signal by a latch and an edge detector of the intermediate timing circuitry;

generating an output signal by the intermediate timing circuitry edge detector responsive to detecting a signal transition of the logic circuitry first stage output signal;

receiving the output signal from the intermediate timing circuitry edge detector by a control input of the intermediate timing circuitry latch; and capturing, by the intermediate timing circuitry latch responsive to the signal received by the control input, the logic circuitry first stage output signal.

* * * * *